United States Patent
Schillinger et al.

(10) Patent No.: US 10,390,435 B2
(45) Date of Patent: Aug. 20, 2019

(54) METHOD FOR ENCASING AN ELECTRIC UNIT AND ELECTRICAL STRUCTURAL ELEMENT

(71) Applicant: Continental Teves AG & Co. oHG, Frankfurt (DE)

(72) Inventors: Jakob Schillinger, Gaimersheim (DE); Dietmar Huber, Rödermark (DE); Svenja Raukopf, Gemünden Felda-Hainbach (DE); Lothar Biebricher, Oberursel (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 0 days.

(21) Appl. No.: 15/898,642

(22) Filed: Feb. 18, 2018

(65) Prior Publication Data

US 2018/0177053 A1    Jun. 21, 2018

Related U.S. Application Data

(63) Continuation of application No. PCT/EP2016/068568, filed on Aug. 3, 2016.

(30) Foreign Application Priority Data

Aug. 25, 2015    (DE) .................. 10 2015 216 217

(51) Int. Cl.
*H05K 3/30* (2006.01)
*H05K 1/18* (2006.01)
(Continued)

(52) U.S. Cl.
CPC ............. *H05K 1/186* (2013.01); *G01R 1/203* (2013.01); *G01R 19/0092* (2013.01);
(Continued)

(58) Field of Classification Search
CPC ................. H05K 1/186; H05K 3/0014; H05K 2203/1316; H05K 2203/1327;
(Continued)

(56) References Cited

U.S. PATENT DOCUMENTS 6,313,598 B1 * 11/2001 Tamba ................ H01L 23/3107
257/692
6,683,250 B2 *  1/2004 Luettgen ............... H01L 23/293
174/50.52
(Continued)

FOREIGN PATENT DOCUMENTS

DE    3720148 A1    2/1988
DE    4325712 A1    2/1995
(Continued)

OTHER PUBLICATIONS

International Search Report and Written Opinion dated Oct. 21, 2016 from corresponding International Patent Application No. PCT/EP2016/068568.
(Continued)

*Primary Examiner* — Donghai D Nguyen

(57) ABSTRACT

A method for encasing an electrical unit includes connecting the electrical unit to a leadframe and encasing the electrical unit with a first plastic material to form an inner molded body, so that a plurality of contacts of the electrical unit project from the inner molded body. The inner molded body is punched out of the lead frame. The method also includes connecting at least one first contact and one second contact to a shunt resistor. The inner molded body is encased with a second plastic material to form an outer molded body.

17 Claims, 7 Drawing Sheets

(51) Int. Cl.
  *G01R 1/20*    (2006.01)
  *G01R 19/00*   (2006.01)
  *H05K 3/00*    (2006.01)
  *H01L 23/31*   (2006.01)
  *H01L 21/56*   (2006.01)
  *H01L 23/495*  (2006.01)

(52) U.S. Cl.
  CPC .......... *H01L 21/56* (2013.01); *H01L 23/3107* (2013.01); *H05K 3/0014* (2013.01); *H01L 23/49531* (2013.01); *H01L 2224/48265* (2013.01); *H05K 2201/10022* (2013.01); *H05K 2203/1316* (2013.01); *H05K 2203/1327* (2013.01); *Y10T 29/49146* (2015.01)

(58) Field of Classification Search
  CPC .......... H05K 2201/10022; H01L 21/56; H01L 23/3107; H01L 23/49531; H01L 2224/48265; G01R 19/0092; G01R 1/203; Y10T 29/49121; Y10T 29/4913; Y10T 29/146
  USPC .......................................... 29/827, 832, 841
  See application file for complete search history.

(56) References Cited

U.S. PATENT DOCUMENTS

| | | | |
|---|---|---|---|
| 7,573,274 B2* | 8/2009 | Aratani | .................. G01R 1/203 324/713 |
| 2003/0011355 A1 | 1/2003 | Skerritt et al. | |

FOREIGN PATENT DOCUMENTS

| | | |
|---|---|---|
| DE | 19640255 A1 | 4/1998 |
| DE | 102007034757 A1 | 2/2008 |
| DE | 102009026804 A1 | 12/2010 |
| DE | 102010061750 A1 | 5/2012 |
| DE | 112010003624 T5 | 8/2012 |
| DE | 202015001193 U1 | 4/2015 |

OTHER PUBLICATIONS

German Search Report dated Aug. 17, 2016 for corresponding German Patent Application No. 10 2015 216 217.6.

* cited by examiner

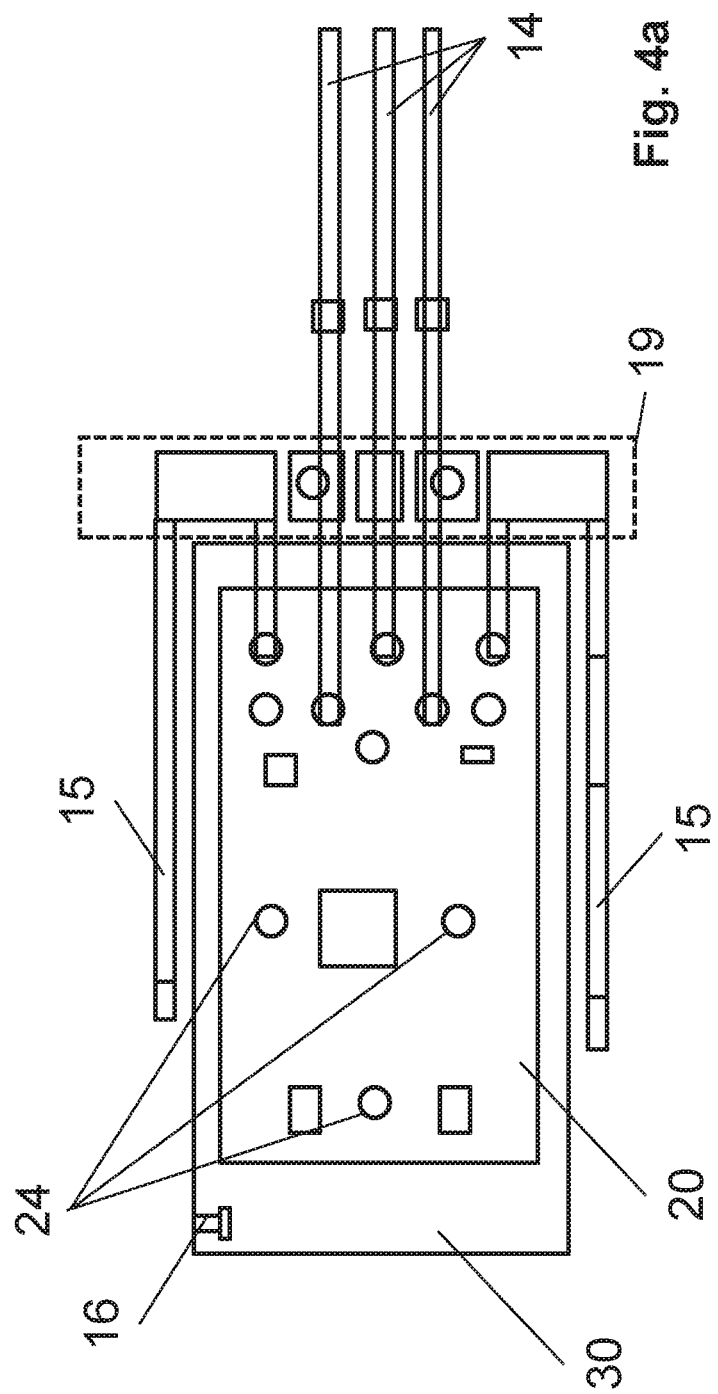
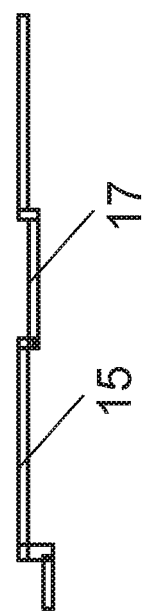
Fig. 4a
Fig. 4b

METHOD FOR ENCASING AN ELECTRIC UNIT AND ELECTRICAL STRUCTURAL ELEMENT

CROSS REFERENCE TO RELATED APPLICATION

This application is a continuation of International application No. PCT/EP2016/068568, filed Aug. 3, 2016, which claims priority to German patent application No. 10 2015 216 217.6, filed Aug. 25, 2015, each of which is hereby incorporated by reference.

TECHNICAL FIELD

The technical field relates to a method for encasing an electrical unit and also to a structural element which is produced by a method of this kind.

BACKGROUND

An electrical unit may be, in particular, an assembly for measuring currents and for forwarding preprocessed measurement signals to a superordinate evaluation electronics or control system. Assemblies of this kind are connected, in particular, to shunt resistors for the purpose of measuring currents. The current to be measured then flows through the shunt resistor and a voltage is measured across the shunt resistor, which voltage in turn permits a conclusion to be drawn about the current.

To date, press-in pins have been welded onto a shunt resistor of this kind. In a molding process, this component would then be connected together with plug terminals to form a thermoplastic housing. In order to ensure the leak-tightness of shunt press-in zones which are formed in the process, the surface was partially laser-treated and then partially cast and cured. The populated printed circuit board was pressed into a housing of this kind and a cover was welded on by means of a laser.

However, the procedure known to date has several disadvantages. Firstly, the electrical unit is located in a cavity. Moisture diffusing into said cavity can lead to migration, to corrosion and to short circuits. The ultrasonic welding technique typically cannot be used as a connection technique for bridges, pole terminals and cable outputs owing to the settling of the printed circuit board. The large number of different processes are costly and resource-intensive.

SUMMARY

A method for encasing an electrical unit includes connecting the electrical unit to a leadframe. The method also includes encasing the electrical unit with a first plastic material for forming an inner molded body, so that a plurality of contacts of the electrical unit project from the inner molded body. The method further includes punching the inner molded body out of the leadframe. The method also includes connecting at least one first contact and one second contact to a shunt resistor. The method further includes encasing the inner molded body with a second plastic material for forming an outer molded body.

When executing the method, the electrical unit is completely enclosed by a typically chemically and mechanically stable plastic material. No corrosion, migration or formation of a short circuit is expected. In addition, ultrasonic welding of additional components can be used. In comparison to methods which are known from the prior art, fewer processes are required in total, this accelerating and simplifying the method sequence.

Connection can be understood to mean, in particular, pressing in, soldering such as hard- or soft-soldering, adhesive bonding, welding such as ultrasonic welding, laser welding or resistance welding, or else sintering. In the connection step, the electrical unit is typically reliably connected to the leadframe for the rest of the process, so that said electrical unit is held in the leadframe. The leadframe can have, for example, plug or crimp terminals. Expressed more generally, metal strips for external contact-connection can already be part of the leadframe.

The leadframe can have index holes and therefore additionally serve as a transportation and adjustment aid.

The electrical unit can be any desired electrical structural element which is suitable for carrying out electrical functions of any kind.

The shunt resistor can have, in particular, a section which is formed from Manganin. Manganin is a typically used and proven resistance material which allows reliable measurement of the through-flowing current by means of tapping off the voltage which is dropped across said resistance material.

The electrical unit used is preferably a populated printed circuit board. Said populated printed circuit board may be, in particular, a circuit for measuring currents. The method has proven particularly advantageous for printed circuit boards of said kind. An integrated circuit ("IC") can also be used for example.

The first plastic material used can be, in particular, a thermoset material. Said thermoset material is, in particular, chemically and mechanically stable.

The second plastic material used can be, in particular, a thermoplastic material. The thermoplastic material is easy to apply and has proven to be an effective external protection means.

The contacts can be connected to the shunt resistor, in particular, by welding, hard-soldering, ultrasonic welding, laser welding, adhesive bonding, soft-soldering, sintering and/or resistance welding. Methods of this kind have proven to be effective for typical applications.

According to one embodiment, the process of connecting the contacts to the shunt resistor is executed after the process of encasing with the first plastic material. As an alternative, the process of connecting the contacts to the shunt resistor can also be executed before the process of encasing with the first plastic material.

In the process of encasing with the first plastic material and/or in the process of encasing with the second plastic material, encasing may be complete in each case, possibly with the exception of projecting contacts. This has proven useful, in particular, because particularly effective chemical and mechanical protection is achieved in this way.

The inner molded body may be connected to the leadframe by way of a number of inserted or anchored support webs after the process of encasing with the first plastic material. This makes it easier to conduct the method and ensures a defined position of the inner molded body.

An inserted support web can be understood to mean, in particular, a support web which can be completely removed from the molded body during the stamping-out process. An anchored support web can be understood to mean, in particular, a support web which is anchored in the molded body in such a way that a portion of the support web remains in the molded body in all cases.

According to one embodiment, a number of convex and/or concave contours are formed in the inner molded body. Said convex and/or concave contours can be used for adjusting further components or else during molding for fixing the first molded body in a second molding tool, that is to say a molding tool for forming the outer molded body.

The first contact, the second contact and/or a number of further contacts can advantageously each have a number of beads. This facilitates handling and leads to better retention in the surrounding structures. In addition, a creepage distance for a liquid which may enter is extended.

The electrical unit can have a number of holes for the purpose of anchoring in the first plastic material. This improves the retention of the electrical unit in the first plastic material, this preventing production faults.

A plug may be formed in the process of encasing with the second plastic material, this allowing simple provision of a connection component. It is also possible for insert parts to be embedded, so that prefabricated elements can be used and concomitantly processed in a simple manner.

In the process of encasing with the second plastic material, a rivet may be molded, specifically in particular for the purpose of connection to an additional component. This allows simple fastening and orientation of the additional component.

According to a further development, additional surface activation of the inner molded body can be performed, in particular before the process of encasing with the second plastic material. This leads to improved adhesion of the outer molded body to the inner molded body.

The material used for the outer molded body, that is to say the second plastic material, can be, in particular, PA (polyamide), PBT (polybutylene terephthalate), hotmelt or PU (polyurethane). Encasing with the second plastic material can be performed, in particular, by injection molding or RIM molding (reaction injection molding).

An electrical structural element may be produced as described in this document. In respect of the method, reference can be made to all of the described embodiments and variants. Explained advantages accordingly apply.

The outer molded body, possibly with projecting components, constitutes the structural element.

The electrical structural element according to the invention provides a structural element which can be produced in a simpler and more reliable manner than is possible with structural elements according to the prior art. In addition, the susceptibility to corrosion is considerably reduced.

BRIEF DESCRIPTION OF THE DRAWINGS

Further features and advantages will be gathered by a person skilled in the art from the exemplary embodiment described below with reference to the appended drawing, in which:

FIG. 4a shows the arrangement after the leadframe has been punched out;

FIG. 4b shows a side view of a terminal with beads;

DETAILED DESCRIPTION

Figure 1:
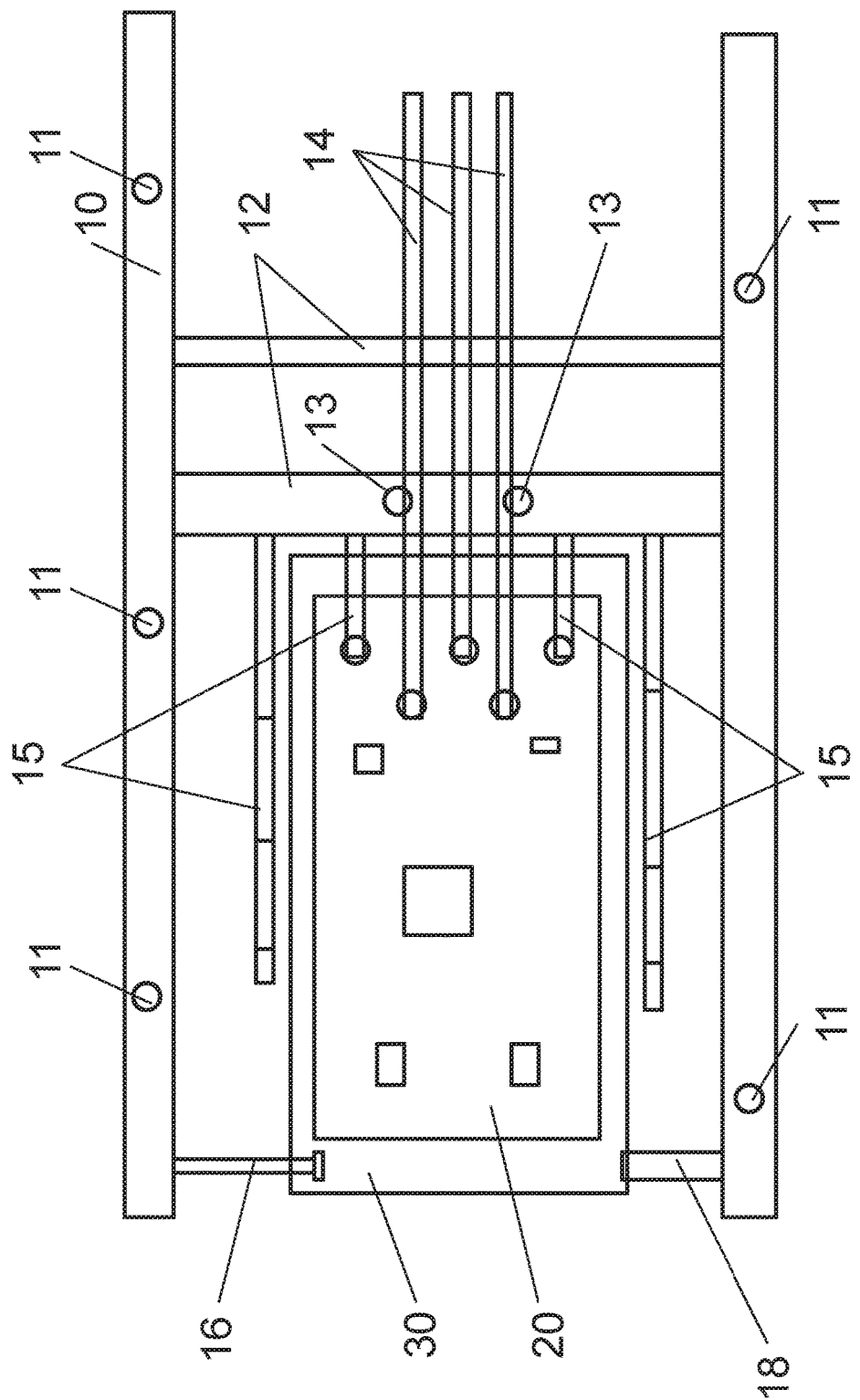
FIG. 1 shows an arrangement comprising an electrical unit in a molded body with a surrounding leadframe.

FIG. 1 shows a leadframe 10 in which index holes 11 are formed is arranged on the outside. The leadframe 10 serves for stabilization purposes and for transportation purposes, wherein it can be easily grasped and moved by means of the index holes 11. The index holes are used to mechanically adjust the leadframe 10 and therefore the already assembled component or a sensor in the various apparatuses and/or molding tools which are used within the scope of the method.

The leadframe 10 has dam bars 12 which stabilize the leadframe 10 and are also designed for the purpose of fitting further components. Fixing holes 13 which can serve to fix the leadframe 10 or further components are formed in the dam bars 12.

The leadframe 10 further has a number of, in the present case three, terminals in the form of plug terminals 14 which serves as electrical contacts after completion of the production method. Furthermore, the leadframe 10 has two shunt connection terminals 15 which serve for connecting a shunt resistor. In addition, the leadframe 10 has an anchored support web 16 and an inserted support web 18. The function of said support webs will be discussed in greater detail below. It is understood that no support webs 16, 18 or a plurality of support webs 16, 18 can also be provided in each case.

An electrical unit in the form of a printed circuit board 20 is connected to the leadframe 10. The printed circuit board 20 is fitted, specifically soldered in the present case, to the plug terminal 14 and the shunt connection terminal 15. However, in principle, the other connection techniques, for example pressing in, described further above can also be used here. This ensures a fixed connection between the printed circuit board 20 and the leadframe 10.

The printed circuit board 20 is surrounded by a first molded body 30 which consists of a thermoset material. The first molded body 30 can also be called the inner molded body. The first molded body 30 may be produced by encasing the printed circuit board 20 with a thermoset material.

As shown in FIG. 1, both the anchored support web 16 and also the inserted support web 18 protrude into the first molded body 30. In this case, the anchored support web 16 is formed such that it has a barb in the first molded body 20. Therefore, it is also referred to as "anchored". In contrast, the inserted support web 18 does not have a barb, so that it can be easily and completely withdrawn from the first molded body 30. However, the anchored support web 16 always remains partially in the first molded body 30, wherein it can be broken off by way of its portion which is situated outside the first molded body 30.

The first molded body 30, in particular owing to its thermoset material, ensures chemical and mechanical protection of the printed circuit board 20, wherein only the plug terminals 14 and the shunt connection terminals 15 project out of the first molded body 30.

As shown, the two shunt connection terminals 15 are of U-shaped design, so that a connection from the printed circuit board 20 to a region next to the printed circuit board 20 is formed. As will be shown further below, this serves for connection of a shunt resistor.

Figure 2:
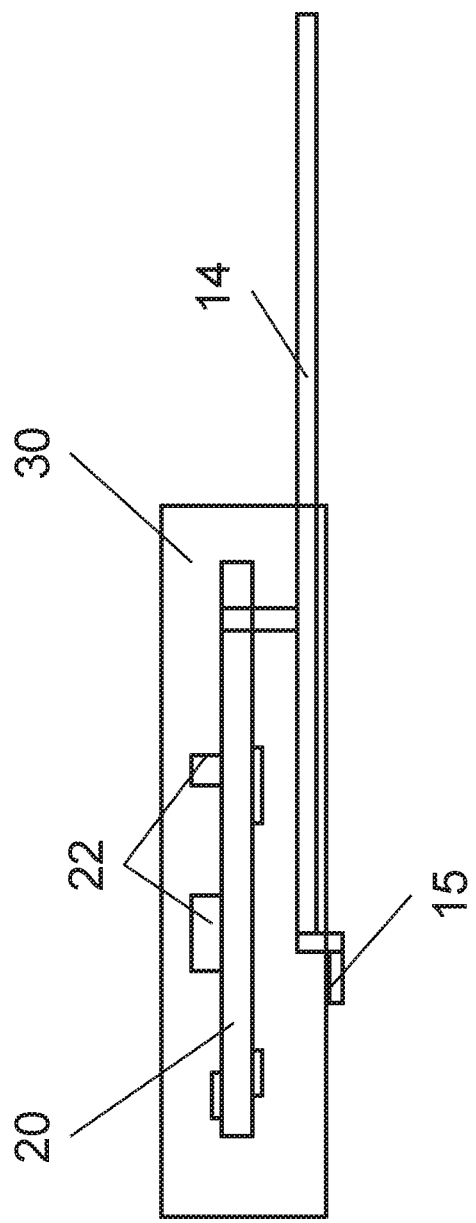
FIG. 2 shows a side view of the arrangement from FIG. 1.

FIG. 2 shows a side view of the arrangement from FIG. 1. FIG. 2 further shows that a number of electrical components 22 are arranged on the printed circuit board 20. In the present case, the electrical components 22 are mounted onto the printed circuit board 20 using SMD (surface-mounted device) technology.

Furthermore, FIG. 2 shows that only the terminals 14, 15 project beyond the first molded body 30 and that the shunt connection terminals 15 protrude beneath the first molded body 30.

Figure 3:
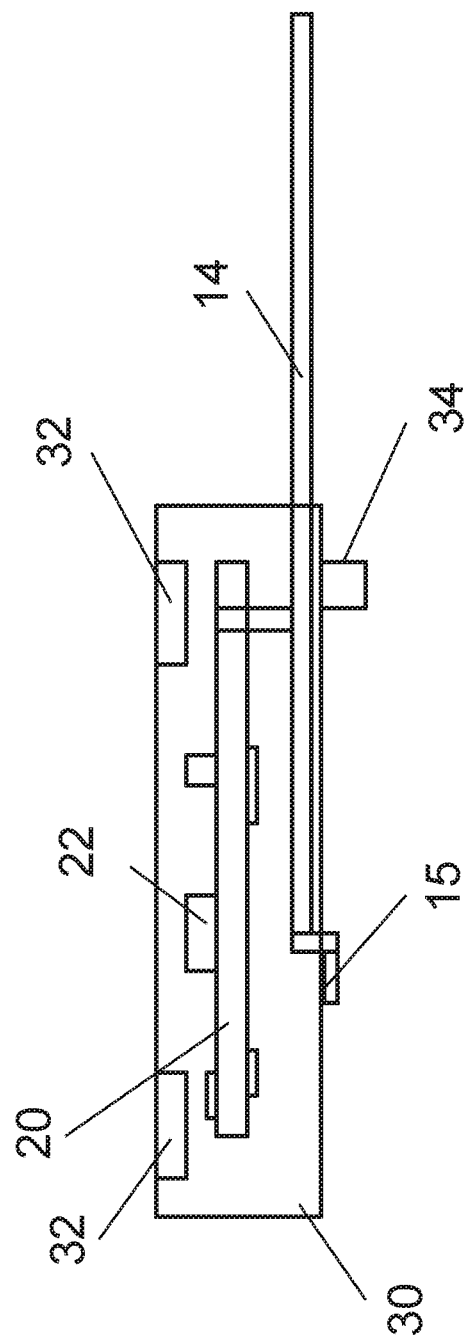
FIG. 3 shows the arrangement from FIG. 2 with further features.

FIG. 3 shows a modification of the arrangement illustrated in FIG. 2. In FIG. 3, two concave fixing elements 32 and one convex fixing element 34 have been formed in the molded body 30. The fixing elements 32, 34 serve to anchor or to fix the molded body 30 in a superordinate structure or else to fit other components to the molded body 30. The fixing elements 32, 34 provide, in particular, the option of forming interlocking connections with other components or superordinate structures, for example to form a molding tool for a further encasing operation.

FIG. 4a shows the arrangement from FIG. 2 after the leadframe 10 has been punched out. Therefore, the leadframe itself can no longer be seen in FIG. 4a. Instead, only the printed circuit board 20 with the first molded body 30 surrounding it is shown in said Figure, wherein the associated terminals 14, 15 which were originally part of the leadframe 10 project out of the first molded body 30. As is also shown in FIG. 4a, a small portion of the anchored support web 16 remains in the first molded body 30.

A number of anchoring holes 24 which serve to better fix the printed circuit board 20 in the first molded body 30 are formed in the printed circuit board 20. Furthermore, a decoupling zone 19 in which a certain degree of mobility is provided between the terminals 14, 15 and the printed circuit board 20 or the first molded body 30 is formed to the right of the first molded body 30. The decoupling zone 19 has proven to be advantageous particularly when the shunt connecting terminal 50 is ultrasonically welded to a shunt resistor since the introduction of vibrations, which may possibly lead to delamination, into the first molded body is prevented.

FIG. 4b shows a side view of a shunt connecting terminal 15 separately from further components. Said Figure shows that, in the embodiment shown here, a bead 17 which extends a creepage distance for moisture and allows better anchoring in a second molded body which is to be subsequently formed is provided.

Figure 5:
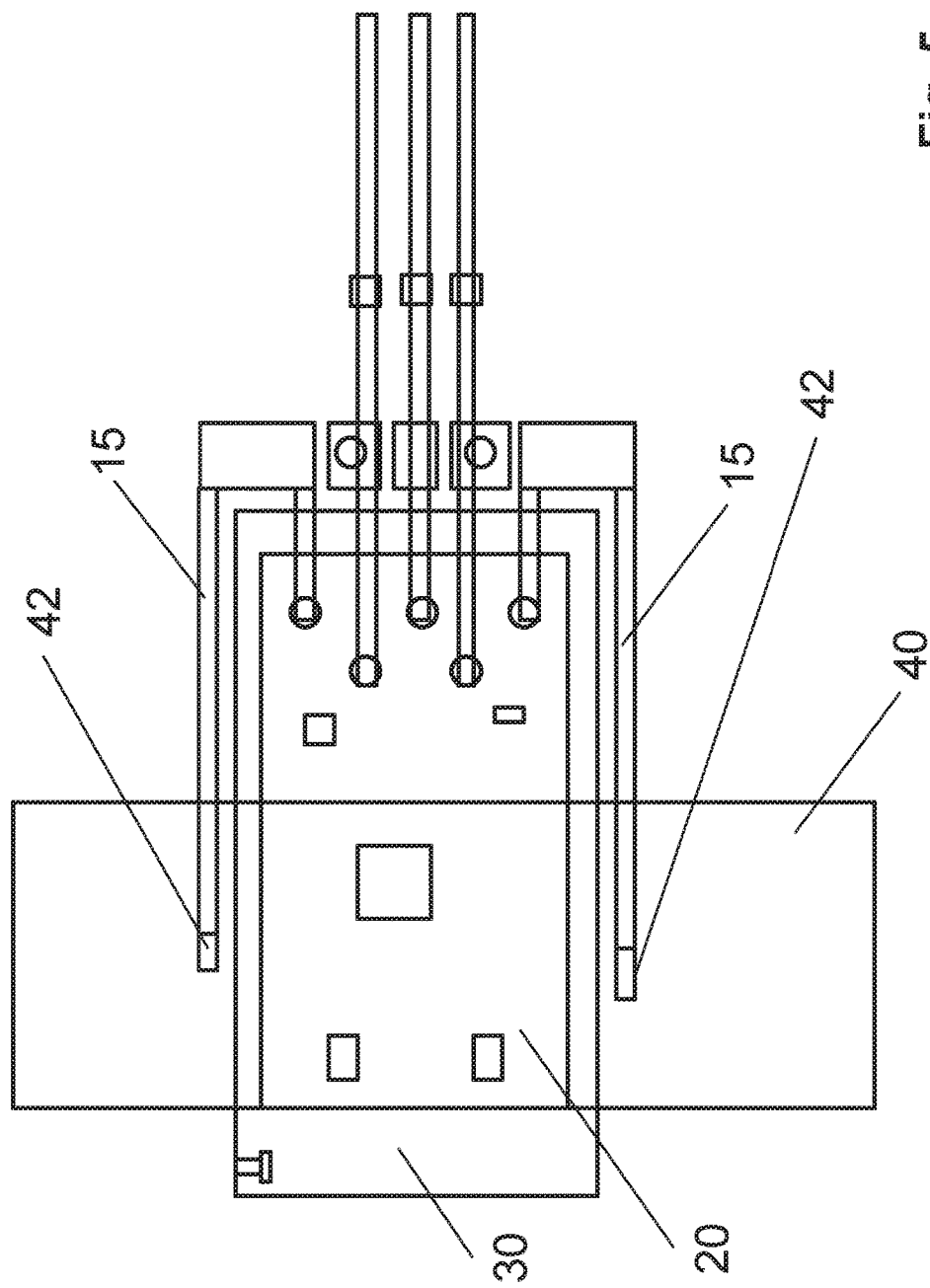
FIG. 5 shows the arrangement from FIG. 4a after it is mounted onto a shunt resistor.

FIG. 5 shows the arrangement from FIG. 4a after a shunt resistor 40 is fitted. In the present case, the shunt resistor 40 is fastened to the shunt connecting terminals 15 by ultrasonic welding at weld points 42 in the process. In principle, other connection techniques such as those described further above can also be used. A voltage which is dropped across the shunt resistor 40 approximately in accordance with a width of the first molded body 30 can be measured by the arrangement shown. This allows a conclusion to be drawn about the current flowing through.

Figure 6:
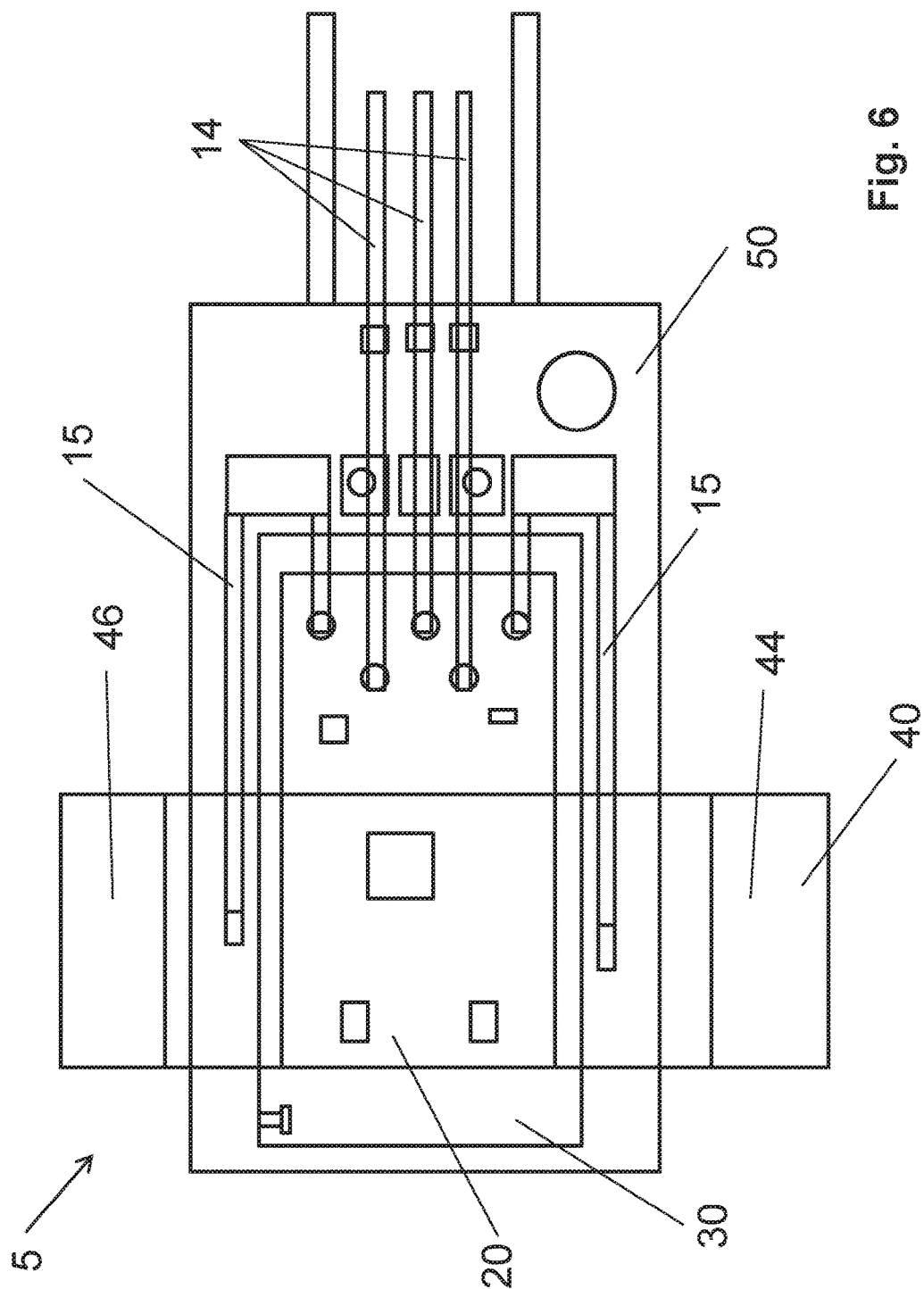
FIG. 6 shows the arrangement from FIG. 5 after it is encased with a thermoplastic.

FIG. 6 shows a state of the arrangement from FIG. 5 after a second molded body 50 is mounted. The second molded body 50 can also be called the outer molded body. In the present case, the second molded body 50 consists of a thermoplastic material and surrounds the printed circuit board 20, the first molded body 30, the shunt connecting terminals 15 and also a large part of the plug terminal 14 and the shunt resistor 40.

The plug terminals 14 project beyond the second molded body 50, so that electrical contact-connection of the printed circuit board 20 is possible. Furthermore, a first contact-making area 44 and a second contact-making area 46 of the shunt resistor 40 project beyond the second molded body 50 in order to allow connection of external components. By way of example, other electrical units or an external electrical circuit can be connected to said contact-making areas 44, 46, wherein a current which flows through the shunt resistor 40 can be measured by the printed circuit board 20. Corresponding signals which are indicative of a current of this kind can be passed to further units by means of the plug terminals 14.

Figure 7:
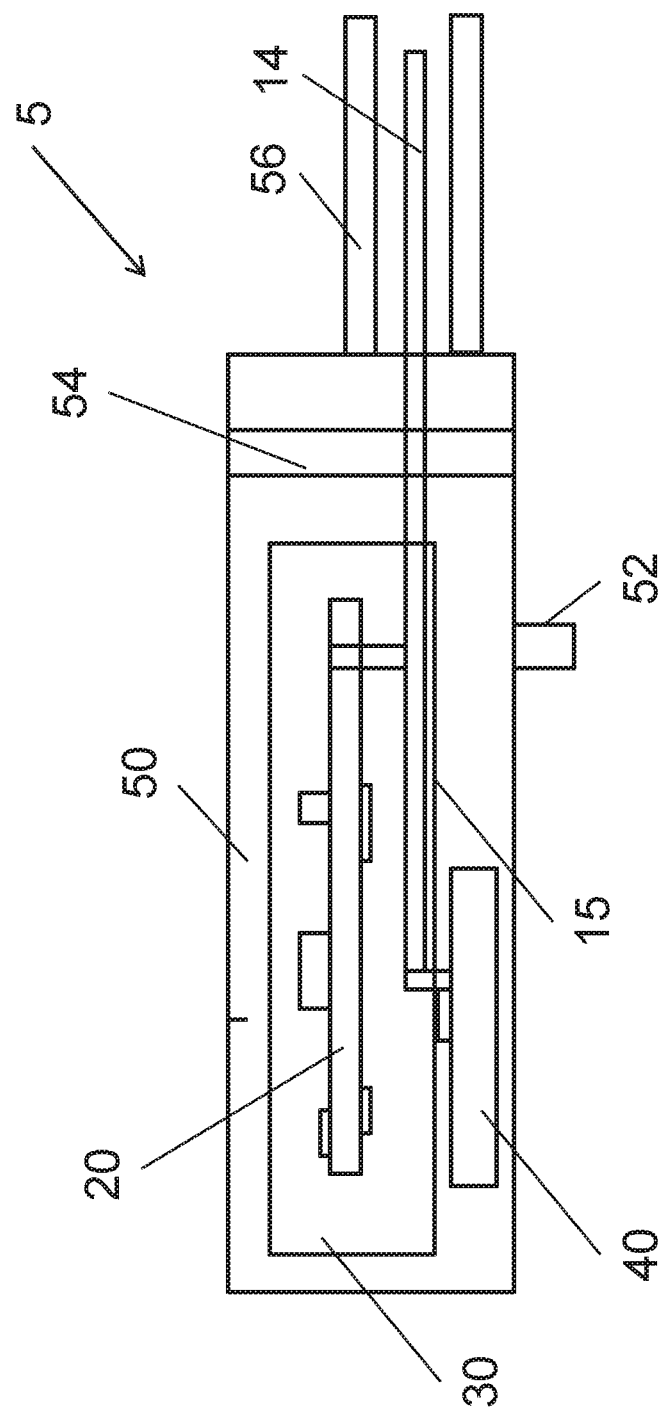
FIG. 7 shows a side view of the arrangement from FIG. 6.

FIG. 7 shows a side view of the arrangement from FIG. 6. Reference is made to the above description in respect of the individual features. It should be noted that FIG. 7 further shows that an insert part in the form of a fastening part 54 is located in the second molded body 30. This allows fastening to other components. Furthermore, a rivet 52 for the purpose of hot-calking is formed on the bottom side. In addition, a plug 56 which allows simple contact-connection of the plug terminal 14 is formed on the right-hand side.

The completed arrangement shown in FIGS. 6 and 7 can be referred to as an electrical component 5 after completion of the method. The completed arrangement can be used in a superordinate component or in a unit such as, for example, a motor vehicle, in particular in order to measure a current.

Mentioned steps of the method may be executed in the indicated order. However, they can also be executed in a different order. In one of its embodiments, for example with a specific combination of steps, the method according to the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that refinements, features and variants that are described in the various embodiments or illustrative embodiments and/or shown in the Figures are combinable with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced dependent claims. These features can also be combined with other features in any way.

Features that are disclosed only in the description or features that are disclosed in the description or in a claim only in conjunction with other features may fundamentally be of independent significance essential to the invention. They can therefore also be individually included in claims for the purpose of distinction from the prior art.

The invention claimed is:

1. A method for encasing an electrical unit, comprising:
connecting the electrical unit to a leadframe;
encasing the electrical unit with a first plastic material for forming an inner molded body, so that a plurality of contacts of the electrical unit project from the inner molded body;
punching the inner molded body out of the leadframe;
connecting at least one first contact and one second contact to a shunt resistor; and
encasing the inner molded body and a portion of the shunt resistor with a second plastic material for forming an outer molded body.

2. The method as set forth in claim 1, wherein the electrical unit used is at least one of a populated printed circuit board and an integrated electrical circuit.

3. The method as set forth in claim 1, wherein the first plastic material is a thermoset material.

4. The method as set forth in claim 1, wherein the second plastic material is a thermoplastic material.

5. The method as set forth in claim 1, wherein the contacts are connected to the shunt resistor by welding, hard-soldering, ultrasonic welding, laser welding, adhesive bonding, soft-soldering, sintering, and/or resistance welding.

6. The method as set forth in claim 1, wherein connecting the contacts to the shunt resistor is executed after encasing with the first plastic material.

7. The method as set forth in claim 1, wherein connecting the contacts to the shunt resistor is executed before encasing with the first plastic material.

8. The method as set forth in claim 1, wherein, after encasing with the first plastic material at least one contact may project through the first plastic material.

9. The method as set forth in claim 1, wherein, after encasing with the second plastic material at least one contact may project through the first plastic material.

10. The method as set forth in claim 1, wherein the inner molded body is connected to the leadframe with at least one anchored or inserted support web after encasing with the first plastic material.

11. The method as set forth in claim 1, wherein at least one concave and/or convex contour is formed in the inner molded body.

12. The method as set forth in claim 1, wherein the first contact, the second contact, and/or a further contact each has at least one bead.

13. The method as set forth in claim 1, wherein the electrical unit defines at least one of hole for anchoring in the first plastic material.

14. The method as set forth in claim 1, wherein, while encasing with the second plastic material, a plug is formed and/or insert parts are embedded.

15. The method as set forth in claim 1, wherein, while encasing with the second plastic material, a rivet is molded for connection to an additional component.

16. The method as set forth in claim 1, wherein the shunt resistor has contact areas project beyond the outer molded body.

17. An electrical structural element formed by:
connecting an electrical unit to a leadframe;
encasing the electrical unit with a first plastic material for forming an inner molded body, so that a plurality of contacts of the electrical unit project from the inner molded body;
punching the inner molded body out of the leadframe;
connecting at least one first contact and one second contact to a shunt resistor; and
encasing the inner molded body and a portion of the shunt resistor with a second plastic material for forming the electrical structural element, wherein the shunt resistor has contact areas project beyond the outer molded body.

* * * * *